United States Patent
Saito

(10) Patent No.: US 7,336,451 B2
(45) Date of Patent: Feb. 26, 2008

(54) MAGNETIC SENSING ELEMENT CONTAINING HALF-METALLIC ALLOY

(75) Inventor: Masamichi Saito, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 419 days.

(21) Appl. No.: 10/348,479

(22) Filed: Jan. 21, 2003

(65) Prior Publication Data

US 2003/0137785 A1 Jul. 24, 2003

(30) Foreign Application Priority Data

Jan. 24, 2002 (JP) ............................. 2002-015001

(51) Int. Cl.
*G11B 5/33* (2006.01)
(52) U.S. Cl. .............................. 360/324.1; 360/324.11; 360/324.12
(58) Field of Classification Search ............ 360/324.11
See application file for complete search history.

(56) References Cited

U.S. PATENT DOCUMENTS

| | | | | |
|---|---|---|---|---|
| 5,793,279 | A * | 8/1998 | Nepela | 338/32 R |
| 6,205,008 | B1 | 3/2001 | Gijs et al. | |
| 6,473,279 | B2 * | 10/2002 | Smith et al. | 360/324.12 |
| 6,603,643 | B2 * | 8/2003 | Hoshiya et al. | 360/324.11 |
| 6,661,626 | B2 * | 12/2003 | Gill | 360/324.2 |
| 6,693,776 | B2 * | 2/2004 | Gill | 360/324.12 |
| 6,721,149 | B1 * | 4/2004 | Shi et al. | 360/324.2 |
| 6,828,897 | B1 * | 12/2004 | Nepela | 338/32 R |
| 6,888,703 | B2 * | 5/2005 | Dieny et al. | 360/324 |
| 2002/0159203 | A1 * | 10/2002 | Saito et al. | 360/324.2 |
| 2003/0104249 | A1 * | 6/2003 | Okuno et al. | 428/693 |

FOREIGN PATENT DOCUMENTS

| | | |
|---|---|---|
| JP | 11-135857 | 5/1999 |
| JP | 2000-106462 | 4/2000 |
| JP | 2001-160640 | 6/2001 |
| JP | 2001-237471 | 8/2001 |
| WO | 08-504303 | 5/1996 |

OTHER PUBLICATIONS

"How Predictable is the Current Perpendicular to Plane Magnetoresistance? (invited)"; W.P. Pratt, Jr., et al.; Journal of Applied Physics 79 (8), Apr. 15, 1996; pp. 5811-5815.
"Andreev Reflection: A New Means to Determine the Spin Polarization of Ferromagnetic Materials"; R.J. Soulen, Jr. et al.; Journal of Applied Physics, vol. 85, No. 8; Apr. 15, 1999.
"New Class of Materials: Half-Metallic Ferromagnets"; R.A. de Groot et al.; Physical Review Letters, vol. 50, No. 25; Jun. 20, 1983.

* cited by examiner

*Primary Examiner*—William Korzuch
*Assistant Examiner*—Tawfik Goma
(74) *Attorney, Agent, or Firm*—Brinks Hofer Gilson & Lione

(57) ABSTRACT

A pinned magnetic layer 20 and a free magnetic layer 26 include a magnetic portion 17 and a magnetic sublayer 22, respectively, each comprising a half-metallic ferromagnetic alloy. Since each of the magnetic portion 17 and magnetic sublayer 22 comprising the half-metallic alloy layer has a larger value $\beta$ and a larger resistivity $\rho$ compared to the conventional CoFe alloy or the like, the change in resistance ($\Delta R$) can be increased, and the rate of change in resistance ($\Delta R/R$) can be appropriately improved.

5 Claims, 7 Drawing Sheets

MAGNETIC SENSING ELEMENT CONTAINING HALF-METALLIC ALLOY

BACKGROUND OF THE INVENTION

1. Field of the Invention

The present invention relates to current-perpendicular-to-plane (CPP) magnetic sensing elements and, more particularly, to a magnetic sensing element in which the rate of change in resistance ($\Delta R/R$) can be effectively improved.

2. Description of the Related Art

FIG. 8 is a partial sectional view of a conventional magnetic sensing element, viewed from the surface facing a recording medium.

The magnetic sensing element shown in FIG. 8 includes a lower electrode 1, an antiferromagnetic layer 2 composed of PtMn or the like formed on the lower electrode 1, a pinned magnetic layer 3 composed of CoFe or the like formed on the antiferromagnetic layer 2, a nonmagnetic material layer 4 composed of Cu or the like formed on the pinned magnetic layer 3, a free magnetic layer 5 composed of NiFe or the like formed on the nonmagnetic material layer 4, and an upper electrode 6 formed on the free magnetic layer 5.

As shown in FIG. 8, the magnetization of the pinned magnetic layer 3 is pinned in the Y direction by an exchange anisotropic magnetic field with the antiferromagnetic layer 2.

The magnetization of the free magnetic layer 5 is aligned in the X direction by a longitudinal bias magnetic field from hard bias layers (not shown in the drawing) formed on both sides in the track width direction (in the X direction) of the free magnetic layer 5.

The magnetic sensing element shown in FIG. 8 is a so-called current-perpendicular-to-plane (CPP) magnetic sensing element in which a current from one of the electrodes 1 and 6 flows through the multilayer film including the antiferromagnetic layer 2 to the free magnetic layer 5 in the thickness direction (in the Z direction).

In the CPP magnetic sensing element, read output can be increased due to the reduction in the element size compared to a current-in-plane (CIP) magnetic sensing element in which a current from the electrode flows parallel to the constituent layers of the multilayer film, and the CPP type is expected to be suitable for decreasing of the element size in connection with increasing recording densities.

One of the problems to be solved in order to implement practical use of CPP magnetic sensing elements in view of increasing recording densities is an improvement in the rate of change in resistance ($\Delta R/R$). In order to improve the rate of change in resistance, a change in resistance ($\Delta R$) must be improved.

It is known that the change in resistance ($\Delta R$) is proportional to $[\beta^2/(1-\beta^2)] \cdot \rho_F \cdot t_F$, where $\beta$ is the value determined by the materials for the ferromagnetic layers (pinned magnetic layer 3 and free magnetic layer 5), and the relationship $\rho\downarrow/\rho\uparrow = (1+\beta)/(1-\beta)$ is satisfied, where $\rho\downarrow$ is the resistivity to spin-down conduction electrons and $\rho\uparrow$ is the resistivity to spin-up conduction electrons. $\rho_F$ is the resistivity of the ferromagnetic layer (the average of resistivity to spin-down conduction electrons and resistivity to spin-up conduction electrons) and $t_F$ is the thickness of the ferromagnetic layer.

As the ferromagnetic layer, a CoFe alloy or the like has been used. In the CoFe alloy, $\beta$ is about 0.5, and the resistivity $\rho_F$ is about 16 $\mu\Omega\cdot$cm.

In "How predictable is the current perpendicular to plane magnetoresistance? (invited)", J. Appl. Phys. 79(8), Apr. 15, 1996, Table 1 discloses that the value $\beta$ of Co is 0.38 to 0.54 and the value $\beta$ of $Ni_{84}Fe_{16}$ is 0.34 to 0.66.

In "Andreev reflection: A new means to determine the spin polarization of ferromagnetic materials", 1999 American Institute of Physics, Graph 4 discloses that the polarizability P of each of NiFe, Co, Ni, and Fe is about 0.33 to 0.45. It is known that the "polarizability P" is correlated with the value $\beta$, and the value $\beta$ (absolute value) increases as the polarizability P increases.

However, with respect to magnetic materials, such as CoFe alloys, Co, $Ni_{84}Fe_{16}$, NiFe, Ni, and Fe, the value $\beta$ and the polarizability P are not sufficiently large. In order to cope with higher recording densities, an improvement in the rate of change in resistance ($\Delta R/R$) is expected by further increasing the change in resistance ($\Delta R$).

SUMMARY OF THE INVENTION

The present invention has been achieved to solve the problems associated with the known techniques described above. It is an object of the present invention to provide a magnetic sensing element in which the change in resistance ($\Delta R$) and the rate of change in resistance ($\Delta R/R$) can be improved by improving materials for magnetic layers and the film structures.

In accordance with the present invention, a magnetic sensing element includes a multilayer film including an antiferromagnetic layer, a pinned magnetic layer, a nonmagnetic material layer, and a free magnetic layer, wherein a current flows perpendicular to the planes of the individual layers of the multilayer film, and at least one of the pinned magnetic layer and the free magnetic layer comprises a half-metallic ferromagnetic alloy.

The present invention relates to the CPP magnetic sensing element, and a sensing current flows perpendicular to the planes of the individual layers of the multilayer film.

The present invention is characterized in that at least one of the pinned magnetic layer and the free magnetic layer comprises a half-metallic ferromagnetic alloy layer. Herein, "half-metallic" means that, in a ferromagnetic material or an antiferromagnetic material, conduction electrons of one spin state behave as metals and conduction electrons of the other spin state behave as insulators.

The magnetic material, such as a CoFe alloy, which has been used for the ferromagnetic layer has metallic properties. In the half-metallic alloy, the value $\beta$ and the polarizability P are larger compared to the CoFe alloy or the like, specifically, with a value $\beta$ (absolute value) of 0.7 or more and a polarizability P (absolute value) of 0.5 or more, and the resistivity $\rho$ is also larger. Therefore, if the pinned magnetic layer and/or the free magnetic layer contain the half-metallic ferromagnetic alloy layer, it is possible to increase the change in resistance ($\Delta R$), thus appropriately improving the rate of change in resistance ($\Delta R/R$).

The reason (mechanism) for the increase in the change in resistance ($\Delta R$) due to the increase in the value $\beta$ is believed to be that, if the value $\beta$ is increased, the resistivity ($\rho\downarrow$) to conduction electrons of one spin state is increased and the resistivity ($\rho\uparrow$) to conduction electrons of the other spin state is decreased. That is, the conduction electrons of one spin state do not easily flow through the ferromagnetic layer or are shut out, and the mean free path of the spin-down conduction electrons is shortened, thus exhibiting insulating behavior. On the other hand, the conduction electrons of the other spin state easily flow through the ferromagnetic layer, and the mean free path of the spin-up conduction electrons is extended, thus exhibiting metallic behavior. Consequently, the difference in mean free path between the spin-up electrons and the spin-down electrons is increased.

The reason (mechanism) for the increase in the change in resistance ($\Delta R$) due to the increase in the polarizability P is believed to be that, if the polarizability P is increased, electrons of one spin state have a higher density of states (i.e., the number increases) in the vicinity of the Fermi level, while electrons of the other spin state have a lower density of states (i.e., the number decreases) in the vicinity of the Fermi level. Consequently, the difference in mean free path between the spin-up electrons and the spin-down electrons is increased.

Such a phenomenon is referred to as spin polarization, and the magnitude of the spin polarization changes depending on the relative relationship in magnetic direction between the free magnetic layer and the pinned magnetic layer.

In the present invention, preferably, the alloy layer is composed of a Heusler alloy represented by the formula $X_2YZ$, wherein X is an element selected from the group consisting of groups IIIA to IIB elements of the periodic table, Y is Mn, and Z is at least one element selected from the group consisting of Al, Si, Ga, Ge, In, Sn, Tl, Pb, and Sb. Specifically, the Heusler alloy is preferably $Co_2MnZ$, wherein Z is at least one element selected from the group consisting of Al, Si, Ga, Ge, and Sn.

In the present invention, preferably, the alloy layer is composed of a Heusler alloy represented by the formula XYZ, wherein X is an element selected from the group consisting of groups IIIA to IIB elements of the periodic table, Y is Mn, and Z is at least one element selected from the group consisting of Al, Si, Ga, Ge, In, Sn, Tl, Pb, and Sb. Specifically, the Heusler alloy is preferably NiMnSb, PtMnSb, PdMnSb, or PtMnSn.

In the present invention, the alloy layer may be composed of $La_{0.7}Sr_{0.3}MnO_3$, $CrO_2$, or $Fe_3O_4$.

In the present invention, preferably, at least one of the pinned magnetic layer and the free magnetic layer has a laminated structure including at least first and second magnetic sublayers, and the first magnetic sublayer is in contact with the nonmagnetic material layer and comprises the half-metallic ferromagnetic alloy. Since the magnetic sublayer in contact with the nonmagnetic material layer is the section which mostly contributes to the rate of change in resistance, by forming the half-metallic ferromagnetic alloy layer in this section, it is possible to improve the change in resistance ($\Delta R$) and the rate of change in resistance ($\Delta R/R$).

In the present invention, preferably, at least one of the pinned magnetic layer and the free magnetic layer has a laminated structure including at least first and second magnetic sublayers, and the second magnetic sublayer is not in contact with the nonmagnetic material layer and comprises the half-metallic ferromagnetic alloy. As described above, although the change in resistance ($\Delta R$) and the rate of change in resistance ($\Delta R/R$) are believed to be improved by forming the half-metallic ferromagnetic alloy layer as the magnetic sublayer in contact with the nonmagnetic material layer, if the alloy layer contains a large amount of Mn, Mn is easily diffused into the nonmagnetic material layer, and there is a possibility that the diffused Mn shortens the spin diffusion length and mean free path of the spin-up conduction electrons, resulting in a decrease in the change in resistance ($\Delta R$) and the rate of change in resistance ($\Delta R/R$). Therefore, when the half-metallic ferromagnetic alloy layer contains a large amount of Mn, preferably, the alloy layer is formed at a distance from the nonmagnetic material layer in order to improve the change in resistance ($\Delta R$) and the rate of change in resistance ($\Delta R/R$).

In the present invention, preferably, the magnetic sublayer other than the magnetic sublayer comprising the half-metallic ferromagnetic alloy layer is composed of a magnetic material selected from the group consisting of CoFe alloys, CoFeNi alloys, NiFe alloys, and Co.

In the present invention, preferably, at least one of the pinned magnetic layer and the free magnetic layer has a triple-layer structure including a central magnetic sublayer and two outer magnetic sublayers, and the central magnetic sublayer comprises the half-metallic ferromagnetic alloy. By separating the nonmagnetic material layer from the alloy layer in this way, the diffusion into the nonmagnetic material layer can be prevented, and the spin diffusion length and mean free path of the conduction electrons can be extended. By separating the alloy layer also from the antiferromagnetic layer, the exchange coupling magnetic field produced between the pinned magnetic layer and the antiferromagnetic layer can be increased.

More preferably, the outer magnetic sublayers comprise a magnetic material selected from the group consisting of CoFe alloys, CoFeNi alloys, NiFe alloys, and Co.

In the present invention, preferably, at least one of the pinned magnetic layer and the free magnetic layer has a laminated ferrimagnetic structure including a first magnetic sublayer, a second magnetic sublayer, and an intermediate nonmagnetic sublayer, the first magnetic sublayer is in contact with the nonmagnetic material layer, and at least the first magnetic sublayer has a multilayer structure including a portion comprising the half-metallic ferromagnetic alloy or a single-layer structure comprising the half-metallic ferromagnetic alloy.

DESCRIPTION OF THE PREFERRED EMBODIMENTS

Figure 1:
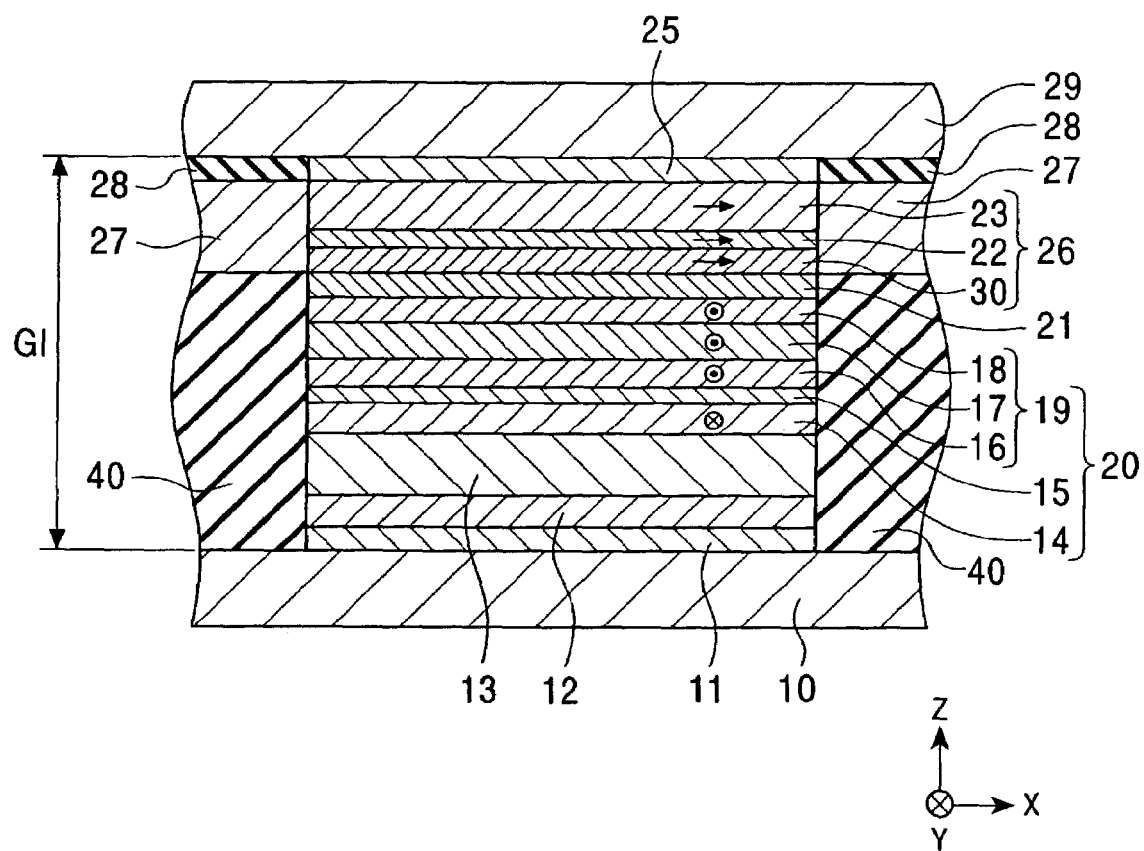
FIG. 1 is a partial sectional view of a magnetic sensing element in a first embodiment of the present invention, viewed from the surface facing a recording medium.

FIG. 1 is a partial sectional view which shows an overall structure of a magnetic sensing element in a first embodiment of the present invention, viewed from the surface facing a recording medium. In FIG. 1, only the central part of the element is shown.

The magnetic sensing element shown in FIG. 1 reads the signals written in the recording medium. Although not shown in the drawing, an inductive head for writing may be deposited on the magnetic sensing element.

The magnetic sensing element is formed on the trailing end of a slider, for example, composed of alumina-titanium carbide ($Al_2O_3$—TiC). The slider is connected to an elastically deformable support composed of a stainless steel or the like at a surface opposite to the surface facing the recording medium, and thus a magnetic head device is produced.

A lower shielding layer 10 is composed of a magnetic material, such as a NiFe alloy and also acts as a lower electrode in this embodiment.

An underlayer 11 composed of a nonmagnetic material is formed on the lower shielding layer 10. The underlayer 11 also acts as a lower gap layer. Preferably, the underlayer 11 is composed of at least one element selected from the group consisting of Ta, Hf, Nb, Zr, Ti, Mo, and W. The underlayer 11, for example, has a thickness of about 50 Å or less.

A seed layer 12 is formed on the underlayer 11. By forming the seed layer 12, the grain diameters, in a direction parallel to the planes, of the individual layers formed on the seed layer 12 can be increased, and current-carrying reliability, such as electromigration resistance, and the rate of change in resistance ($\Delta R/R$) can be more appropriately improved.

The seed layer 12 is composed of a NiFe alloy, a NiFeCr alloy, or Cr. The seed layer 12 may be omitted.

An antiferromagnetic layer 13 is formed on the seed layer 12. Preferably, the antiferromagnetic layer 13 is composed of an antiferromagnetic material containing X and Mn, where X is at least one element selected from the group consisting of Pt, Pd, Ir, Rh, Ru, and Os. Alternatively, preferably, the antiferromagnetic layer 13 is composed of an antiferromagnetic material containing, X, X', and Mn, wherein X' is at least one element selected from the group consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, Pb, and rare-earth elements.

Such antiferromagnetic materials exhibit superior corrosion resistance and high blocking temperatures and can generate large exchange coupling magnetic fields at the interface with a pinned magnetic layer 20 which will be described below. Preferably, the antiferromagnetic layer 13 has a thickness of 80 to 300 Å.

The pinned magnetic layer 20 is formed on the antiferromagnetic layer 13. In this embodiment, the pinned magnetic layer 20 has a five-layered structure.

The pinned magnetic layer 20 includes a second magnetic sublayer 14 which is single-layered, a first magnetic sublayer 19 which is multilayered, and an intermediate nonmagnetic sublayer 15 interposed therebetween. In such a structure, the magnetization directions of the second magnetic sublayer 14 and the first magnetic sublayer 19 are antiparallel to each other, which is referred to as a laminated ferrimagnetic structure. In this specification, in the laminated ferrimagnetic structure, the magnetic sublayer in contact with a nonmagnetic material layer 21 is referred to as the first magnetic sublayer and the other magnetic sublayer is referred to as the second magnetic sublayer. The intermediate nonmagnetic sublayer 15 is composed of at least one element selected from the group consisting of Ru, Rh, Ir, Cr, Re, and Cu, and is preferably composed of Ru.

An exchange anisotropic magnetic field is generated between the antiferromagnetic layer 13 and the second magnetic sublayer 14, which is in contact with the antiferromagnetic layer 13, of the pinned magnetic layer 20 by annealing in a magnetic field. For example, when the magnetization direction of the second magnetic sublayer 14 is pinned in the height direction (in the Y direction), the magnetizations of the three magnetic portions constituting the first magnetic sublayer 19 are oriented and pinned in a direction opposite to the height direction (in a direction opposite to the Y direction) due to the RKKY interaction. In such a structure, the magnetization of the pinned magnetic layer 20 can be in a stable state, and the apparent exchange anisotropic magnetic field at the interface between the pinned magnetic layer 20 and the antiferromagnetic layer 13 can be increased.

For example, the second magnetic sublayer 14 has a thickness of about 10 to 70 Å, and the first magnetic sublayer 19 which is multilayered has a thickness of about 20 to 80 521 . The intermediate nonmagnetic sublayer 15 has a thickness of about 3 to 10 Å.

The second magnetic sublayer 14 and the first magnetic sublayer 19 have different magnetic moments per unit area. The magnetic moment is defined as the product of saturation magnetization Ms and layer thickness t. By setting the magnetic moment of the second magnetic sublayer 14 to be different from the magnetic moment of the first magnetic sublayer 19, it is possible to form the second magnetic sublayer 14 and the first magnetic sublayer 19 so as to have a laminated ferrimagnetic structure.

The nonmagnetic material layer 21 is formed on the first magnetic sublayer 19. The nonmagnetic material layer 21 is composed of a conductive material with low electrical resistance, such as Cu. For example, the nonmagnetic material layer 21 has a thickness of about 25 Å.

A free magnetic layer 26 is formed on the nonmagnetic material layer 21. In this embodiment, the free magnetic layer 26 has a triple-layer structure. Preferably, the total thickness of the free magnetic layer 26 is about 20 to 200 Å.

A protective layer 25 composed of a nonmagnetic material is formed on the free magnetic layer 26. The protective layer 25 also acts as an upper gap layer. The protective layer 25 is preferably composed of at least one element selected from the group consisting of Ta, Hf, Nb, Zr, Ti, Mo, and W. The protective layer 25, for example, has a thickness of about 50 Å or less.

As shown in FIG. 1, the lower shielding layer 10 extends in the track width direction (in the X direction) from both sides of the multilayer film including the underlayer 11 to the protective layer 25. Insulating layers 40 composed of an insulating material, such as $Al_2O_3$ or $SiO_2$, are formed at both sides in the track width direction (in the X direction) of the multilayer film and on the extending lower shielding layer 10. In this embodiment, the upper surface of the insulating layer 40 is lower than the lower surface of the free magnetic layer 26, and a hard bias layer 27 composed of a CoPtCr alloy or the like which is formed on the insulating layer 40 is magnetically coupled to each end face of the free magnetic layer 26. Additionally, at least a part of the hard bias layer 27 must be magnetically coupled to each end of the free magnetic layer 26. Since a longitudinal bias magnetic field is applied from the hard bias layer 27 to the free magnetic layer 26, the magnetization of the free magnetic layer 26 is aligned in a single domain state parallel to the track width direction (the X direction). Unlike the magnetization state of the pinned magnetic layer 20, the free magnetic layer 26 is weakly aligned in a single domain state so that the magnetization can be reversed in response to an external magnetic field.

An insulating layer 28 composed of an insulating material, such as $Al_2O_3$ or $SiO_2$, is formed on the hard bias layer 27. In this way, the hard bias layer 27 is sandwiched between the insulating layers 40 and 28.

As shown in FIG. 1, the upper surface of the protective layer 25 is substantially flush with the upper surface of the insulating layer 28. An upper shielding layer 29 composed of a magnetic material, such as a NiFe alloy, is formed over the protective layer 25 and the insulating layers 28. The upper shielding layer 29 also acts as an upper electrode of the magnetic sensing element.

In the embodiment shown in FIG. 1, since the lower shielding layer 10 and the upper shielding layer 29 also function as electrodes in addition to as shields, a gap length Gl can be determined by the thickness of the laminate including the underlayer 11 to the protective layer 25, and the gap length Gl can be decreased.

In the embodiment shown in FIG. 1, the magnetic sensing element is of a current-perpendicular-to-plane (CPP) type in which the shielding layers 29 and 10 which also act as electrodes are disposed on the top and bottom of the multilayer film including the underlayer 11 to the protective layer 25, and a current flows between the shielding layers 10 and 29 in the thickness direction of the multilayer film (in the Z direction). The current flows through the multilayer film properly without being shunted into the hard bias layer 27 because the top and bottom of the hard bias layer 27 are surrounded with the insulating layers 28 and 40, thus improving the read output.

In the magnetic sensing element, the recording medium, such as a hard disk, travels in the Z direction. When a leakage magnetic field is applied in the Y direction from the recording medium, the magnetization direction of the free magnetic layer 26 is changed from the X direction to the Y direction. Electrical resistance changes due to the relationship between the varying magnetization direction of the free magnetic layer 26 and the pinned magnetization direction of the first magnetic sublayer 19 of the pinned magnetic layer 20, which is referred to as the magnetoresistance effect, and the leakage magnetic field from the magnetic recording medium is detected by a voltage change based on the change in the electrical resistance.

The features of the magnetic sensing element shown in FIG. 1 will be described below. In the embodiment shown in FIG. 1, the first magnetic sublayer 19 of the pinned magnetic layer 20, in contact with the nonmagnetic material layer 21, has a triple-layer structure. Since the first magnetic sublayer 19 is the layer which actually contributes to the magnetoresistance effect, by forming the first magnetic sublayer 19 so as to have the structure described below, it is possible to obtain a higher change in resistance ($\Delta R$) and a higher rate of change in resistance ($\Delta R/R$) compared to the conventional case.

Among the three magnetic portions constituting the first magnetic sublayer 19, the central portion 17 is a half-metallic ferromagnetic alloy layer. The alloy layer must be "ferromagnetic" because the portion composed of the alloy constitutes a part of the first magnetic sublayer 19 and the magnetization must be properly pinned in the height direction Y direction. Being "half-metallic" means that, in a ferromagnetic material or an antiferromagnetic material, conduction electrons of one spin state behave as metals and conduction electrons of the other spin state behave as insulators.

The change in resistance ($\Delta R$) is proportional to $[\beta^2/(1-\beta^2)] \cdot \rho_F \cdot t_F$, where $\beta$ is the value determined by the material for the magnetic portion 17, $\beta$ being greater than −1 and less than 1, and as the value $\beta$ is increased, the change in resistance ($\Delta R$) can be increased. The value $\beta$ of the half-metallic ferromagnetic alloy is greater than that of the CoFe alloy or NiFe alloy which has been used as the ferromagnetic layer, and thus the "half-metallic" property is imparted. In the present invention, a ferromagnetic alloy with a value $\beta$ (absolute value) of 0.7 or more or with a polarizability P (absolute value), which will be described below, of 0.5 or more is defined as being "half-metallic".

With respect to the value $\beta$, the relationship $\rho\!\downarrow/\rho\!\uparrow = (1+\beta)/(1-\beta)$ is satisfied, where $\rho\!\downarrow$ is the resistivity to spin-down conduction electrons and $\rho\!\uparrow$ is the resistivity to spin-up conduction electrons. That is, as the value $\beta$ is increased, $\rho\!\downarrow$ is increased and $\rho\!\uparrow$ is decreased.

As the value $\beta$ is increased, since the resistivity ($\rho\!\downarrow$) to spin-down conduction electrons is increased, the spin-down conduction electrons do not easily flow through the ferromagnetic layer or are shut out, and the mean free path of the spin-down conduction electrons is shortened, thus exhibiting insulating behavior. On the other hand, since the resistivity ($\rho\!\uparrow$) to spin-up conduction electrons is decreased, the spin-up conduction electrons easily flow through the ferromagnetic layer, and the mean free path of the spin-up conduction electrons is extended, thus exhibiting metallic behavior. Consequently, the difference in mean free path between the spin-up electrons and the spin-down electrons is increased. Such a phenomenon is referred to as spin polarization. In the half-metallic ferromagnetic alloy having a high value $\beta$, specifically a value $\beta$ (absolute value) of 0.7 or more, the spin polarization is strongly exhibited, and the mean free path is further increased.

The change in resistance ($\Delta R$) and the rate of change in resistance ($\Delta R/R$) are positively correlated with the difference in mean free path between the spin-up conduction electrons and the spin-down conduction electrons. Consequently, since the difference in mean free path between the spin-up conduction electrons and the spin-down conduction electrons is increased due to the use of the half-metallic alloy having a higher value $\beta$ than that of the conventional case, the change in resistance ($\Delta R$) and the rate of change in resistance ($\Delta R/R$) are increased, and thus it is possible to produce a magnetic sensing element which is suitable for higher recording densities.

Whether the "half-metallic" property is possessed or not may be also determined by the polarizability P besides the value $\beta$. It is known that the polarizability P is correlated with the $\beta$ value and the $\beta$ value (absolute value) increases as the polarizability P increases.

Since the polarizability P is proportional to the change in resistance ($\Delta R$), as the polarizability P is increased, the change in resistance ($\Delta R$) can be increased. The polarizability P is represented by the relationship $P = (N\!\uparrow - N\!\downarrow)/(N\!\uparrow + N\!\downarrow)$, where $-1 \leq P \leq 1$, $N\!\uparrow$ is the number of spin-up conduction electrons in the vicinity of the Fermi level, and $N\!\downarrow$ is the number of spin-down conduction electrons in the vicinity of the Fermi level. The conduction electrons in the vicinity of the Fermi level actually contribute to conduction.

In accordance with the relationship described above, as $N\!\uparrow$ is increased, i.e., as the density of states in the vicinity of the Fermi level is increased, (i.e., as the number increases), and $N\!\downarrow$ is decreased, i.e., the density of states in the vicinity of the Fermi level is decreased, (i.e., the number decreases), the polarizability P is increased, and the change in resistance ($\Delta R$) is thereby increased.

An increase in $N\!\uparrow$ and a decrease in $N\!\downarrow$ mean that since the spin-up conduction electrons easily flow through the ferromagnetic layer, the mean free path of the spin-up conduction electrons is extended, and since the spin-down conduction electrons do not easily flow through the ferromagnetic layer or are shut out, the mean free path of the spin-down conduction electrons is shortened. Consequently, the difference in mean free path between the spin-up electrons and the spin-down electrons is increased, resulting in an increase in the change in resistance ($\Delta R$).

Accordingly, preferably, a half-metallic ferromagnetic alloy having a high polarization P is used for the magnetic portion 17. Specifically, the polarizability P (absolute value) is preferably 0.5 or more. In the present invention, a ferromagnetic material having a polarizability P (absolute value) of 0.5 or more is defined as being "half-metallic".

Additionally, the magnitude of the spin polarization changes depending on the relationship in magnetization direction between the free magnetic layer 26 and the pinned magnetic layer 20.

In the half-metallic ferromagnetic alloy layer, since the resistivity ($\rho_F$) is also larger than that of a CoFe alloy or the like, by forming the central magnetic portion 17 of the first magnetic sublayer 19 using the half-metallic ferromagnetic alloy, it is possible to improve the change in resistance ($\Delta R$) and the rate of change in resistance ($\Delta R/R$). Herein, the "resistivity $\rho_F$" corresponds to the average of resistivity to spin-down conduction electrons and resistivity to spin-up conduction electrons.

The material used for the magnetic portion 17 is the half-metallic ferromagnetic alloy as described above and also preferably has a Curie temperature (Tc) of 200° C. or more. If the Curie temperature (Tc) is less than 200° C., it is not possible to actually use the element as a device in view of ambient temperature. The resistivity $\rho_F$ is preferably 50 $\mu\Omega\cdot$cm or more. Thereby, the change in resistance ($\Delta R$) and the rate of change in resistance ($\Delta R/R$) can be more appropriately improved compared with the conventional case in which a CoFe alloy or the like is used as the magnetic portion. In the present invention, preferably, the rate of change in resistance ($\Delta R/R$) is 30% or more.

In the present invention, examples of materials for the half-metallic ferromagnetic alloy layer include the following materials (1) to (3).

(1) A Heusler alloy represented by the formula $X_2YZ$, wherein X is an element selected from the group consisting of groups IIIA to IIB elements of the periodic table, Y is Mn, and Z is at least one element selected from the group consisting of Al, Si, Ga, Ge, In, Sn, Tl, Pb, and Sb The Heusler alloy has a L2 crystal structure. Specifically, the Heusler alloy may be $Co_2MnZ$, wherein Z is at least one element selected from the group consisting of Al, Si, Ga, Ge, and Sn.

Examples of Heusler alloys which contain two or more elements as Z include $Co_{0.5}Mn_{0.25}(Al_{100-a}Si_a)_{0.25}$, wherein a is 0 to 100.

(2) A Heusler alloy represented by the formula XYZ, wherein X is an element selected from the group consisting of groups IIIA to IIB elements of the periodic table, Y is Mn, and Z is at least one element selected from the group consisting of Al, Si, Ga, Ge, In, Sn, Tl, Pb, and Sb.

The Heusler alloy has a $C1_2$ crystal structure. Specific examples of the Heusler alloy include NiMnSb, PtMnSb, PdMnSb, and PtMnSb.

The polarizabilities P of these materials will be described. In "Andreev reflection: A new means to determine the spin polarization of ferromagnetic materials", 1999 American Institute of Physics, Graph 4 discloses that the polarizability P of NiMnSb is 0.55.

In "New Class of Materials: Half-Metallic Ferromagnets", 1983 The American Physical Society, Table 1 shows N(E)↑ and N(E)↓ of NiMnSb, PtMnSb, PdMnSb, and PtMnSn theoretically calculated, and as a result of calculation based on these values, the polarizability P of NiMnSb is 1, the polarizability P of PtMnSb is 1, the polarizability P of PdMnSb is 0.51, and the polarizability P of PtMnSn is −0.33. Additionally, with respect to PtMnSn, it is believed that the polarizability P (absolute value) can be set at 0.5 or more by adjusting the compositional ratio. (3) $La_{0.7}Sr_{0.3}MnO_3$, $CrO_2$, or $Fe_3O_4$ In "Andreev reflection: A new means to determine the spin polarization of ferromagnetic materials", 1999 American Institute of Physics, Graph 4 discloses that the polarizability P of $La_{0.7}Sr_{0.3}MnO_3$ is 0.55 and the polarizability P of $CrO_2$ is 0.9.

With respect to each of the Heusler alloys, $La_{0.7}Sr_{0.3}MnO_3$, $CrO_2$, or $Fe_3O_4$ described above, half-metallic ferromagnetic properties are exhibited if the value $\beta$ (absolute value) is 0.7 or more or the polarizability P (absolute value) is 0.5 or more. By forming the magnetic portion 17 using any one of these materials, the change in resistance ($\Delta R$) and the rate of change in resistance ($\Delta R/R$) can be improved compared to the conventional case. Each of these materials has a Curie temperature (Tc) of 200° C. or more and a resistivity ($\rho_F$) of 50 $\mu\Omega\cdot$cm or more.

Each of the magnetic portions 18 and 16 formed on the top and bottom of the magnetic portion 17 is preferably composed of a magnetic material which has been conventionally used, such as a CoFe alloy, a CoFeNi alloy, a NiFe alloy, or Co.

By forming the magnetic portion 18 in contact with the nonmagnetic material layer 21 using a magnetic material, such as a CoFe alloy, diffusion of elements between the magnetic portion 18 and the nonmagnetic material layer 21 can be more appropriately prevented, the spin diffusion length and mean free path of the spin-up conduction electrons can be extended, and the change in resistance ($\Delta R$) and the rate of change in resistance ($\Delta R/R$) can be appropriately improved.

For Example, if the magnetic portion 18 is composed of a Heusler alloy of (1) or (2), Mn contained in the Heusler alloy is diffused into the nonmagnetic material layer 21 composed of Cu or the like, and the diffused Mn may shorten the spin diffusion length and mean free path of the spin-up conduction electrons, resulting in a decrease in the change in resistance ($\Delta R$) and the rate of change in resistance ($\Delta R/R$). Therefore, as shown in FIG. 1, by placing the magnetic portion 17 composed of a half-metallic ferromagnetic alloy away from the nonmagnetic material layer 21 and interposing the magnetic portion 18 composed of a CoFe alloy or the like between the magnetic portion 17 and the nonmagnetic material layer 21, the diffusion can be appropriately prevented. Preferably, the magnetic portion 18 is composed of a CoFe alloy because the diffusion can be prevented more reliably.

As shown in FIG. 1, by interposing the magnetic portion 16 composed of a CoFe alloy or the like between the magnetic portion 17 composed of a half-metallic ferromagnetic alloy and the intermediate nonmagnetic sublayer 15, antiferromagnetic coupling with the second magnetic sublayer 14 due to the RKKY interaction is believed to be strengthened, and the magnetization of the first magnetic sublayer 19 can be pinned appropriately.

The pinned magnetic layer 20 shown in FIG. 1 has a laminated ferrimagnetic structure in which the intermediate nonmagnetic sublayer 15 is interposed between the second magnetic sublayer 14 and the first magnetic sublayer 19. In order to strengthen pinning of the pinned magnetic layer 20, antiferromagnetic coupling due to the RKKY interaction between the second magnetic sublayer 14 and the first magnetic sublayer 19 must be strengthened. In order to strengthen the antiferromagnetic coupling due to the RKKY interaction, preferably, the second magnetic sublayer 14 and the magnetic portion 16 in contact with the intermediate nonmagnetic sublayer 15 are composed of a magnetic material, such as a CoFe alloy. Accordingly, in the present invention, the magnetic portion 16 is composed of a magnetic material, such as a CoFe alloy. The magnetic portion 16 is preferably composed of a CoFe alloy because the antiferromagnetic coupling due to the RKKY interaction can be further strengthened.

In the embodiment shown in FIG. 1, the free magnetic layer 26 has a triple-layer structure including three magnetic sublayers, and among the three magnetic sublayers, the central magnetic sublayer 22 is a half-metallic ferromagnetic alloy layer, and the magnetic sublayers 23 and 30 sandwiching the central magnetic sublayer 22 are preferably composed of a magnetic material selected from the group consisting of CoFe alloys, CoFeNi alloys, and Co.

In the free magnetic layer 26, as in the case of the pinned magnetic layer 20, since the half-metallic ferromagnetic alloy layer is included, the difference in mean free path between spin-up conduction electrons and spin-down conduction electrons can be increased, and the change in resistance ($\Delta R$) and the rate of change in resistance ($\Delta R/R$) can be improved, and thus it is possible to produce a magnetic sensing element which is suitable for higher recording densities.

By forming the magnetic sublayer 30 in contact with the nonmagnetic material layer 21 using a magnetic material, such as a CoFe alloy, diffusion between the magnetic sublayer 30 and the nonmagnetic material layer 21 can be appropriately prevented, the spin diffusion length and mean free path of the spin-up conduction electrons can be extended properly, and the change in resistance ($\Delta R$) and the rate of change in resistance ($\Delta R/R$) can be more appropriately improved. If the magnetic sublayer 30 is composed of a CoFe alloy, the diffusion can be prevented more appropriately.

By forming the magnetic sublayer 23 using a material which has a smaller coercive force than that of a half-metallic ferromagnetic alloy, sensitivity of the free magnetic layer 26 to the recording magnetic field can be improved. More preferably, the magnetic sublayer 23 is composed of a NiFe alloy.

The magnetization of the free magnetic layer 26 must be reversed sensitively in response to an external magnetic field so that a magnetic sensing element having excellent read characteristics is produced. Most of the half-metallic alloys, such as the Heusler alloys, etc., described in (1) to (3) have large coercive forces Hc, specifically, of 10 Oe (about 790 A/m) or more. When the magnetic sublayer 30 in contact with the nonmagnetic material layer 21 is composed of a CoFe alloy, the CoFe alloy has a relatively large coercive force Hc. Therefore, in order to improve the sensitivity of the free magnetic layer 26 to the external magnetic field, preferably, a magnetic sublayer having a small coercive force Hc is incorporated into the free magnetic layer 26. The magnetic sublayer 23 corresponds to this, and since the magnetic sublayer 23 composed of a NiFe alloy has a smaller coercive force Hc compared to the magnetic layers composed of half-metallic alloys, CoFe alloys, etc., by incorporating the magnetic sublayer 23 having a small coercive force Hc into the free magnetic layer 26, it is possible to produce a magnetic sensing element having excellent read characteristics in which the magnetization is reversed sensitively in response to the external magnetic field.

All the magnetic sublayers and magnetic portions constituting the pinned magnetic layer 20 and the free magnetic layer 26 must be composed of materials whose $\beta$ values and P values have the same sign.

That is, for example, when the magnetic portion 17 and the magnetic sublayer 22 which are composed of the half-metallic ferromagnetic alloy layers have positive $\beta$ values, the magnetic portions 16 and 18 and the magnetic sublayers 30 and 23 must also be composed of magnetic materials having positive $\beta$ values. With respect to the half-metallic ferromagnetic alloy layer having a positive $\beta$ value which is high, specifically at 0.7 or more, the action (spin polarization) of extending the mean free path of spin-up conduction electrons (exhibiting metallic behavior) and shortening the mean free path of spin-down conduction electrons (exhibiting insulating behavior) is strongly exerted, and the difference in mean free path between the spin-up electrons and the spin-down electrons is increased compared to the case in which a metallic material, such as a CoFe alloy, is used.

On the other hand, with respect to the half-metallic ferromagnetic alloy layer having negative values, the action of extending the mean free path of spin-down conduction electrons and shortening the mean free path of spin-up conduction electrons is exerted. The same thing applies to the polarizability P.

Herein, although the magnetic portions 16 and 18 and the magnetic sublayers 30 and 23 composed of CoFe alloys or the like have spin polarization, their $\beta$ values are positive. If the magnetic portion 17 and the magnetic sublayer 22 which are half-metallic ferromagnetic alloy layers have negative $\beta$ values, the spin polarization is cancelled out by the magnetic portions 16 and 18 and the magnetic sublayers 30 and 23 having positive $\beta$ values. Therefore, it is not possible to appropriately increase the difference in mean free path between spin-up conduction electrons and spin-down conduction electrons, thus being unable to effectively increase the change in resistance ($\Delta R$) and the rate of change in resistance ($\Delta R/R$).

Additionally, when the $\beta$ value is negative and the polarizability P is negative as in the case of PtMnSb, by selecting ferromagnetic materials having negative $\beta$ values and polarizability P for the pinned magnetic layer 20 and the free magnetic layer 26, the spin polarization can be increased and the change in resistance ($\Delta R$) can be effectively increased. Examples of such ferromagnetic materials include FeV ($\beta$ value: about $-0.11$), NiCr ($\beta$ value: about $-0.24$ to $-0.11$), and FeCr ($\beta$ value: about $-0.09$).

As described above, in the present invention, the magnetic portions 16, 17, and 18 constituting the pinned magnetic layer 20 and the magnetic sublayers 30, 22, and 23 constituting the free magnetic layer 26 are composed of materials whose $\beta$ values have the same sign, and the spin polarization is geometrically increased. Thus, the difference in mean free path between spin-up conduction electrons and spin-down conduction electrons can be increased, and the change in resistance ($\Delta R$) and the rate of change in resistance ($\Delta R/R$) can be appropriately improved.

Figure 2:
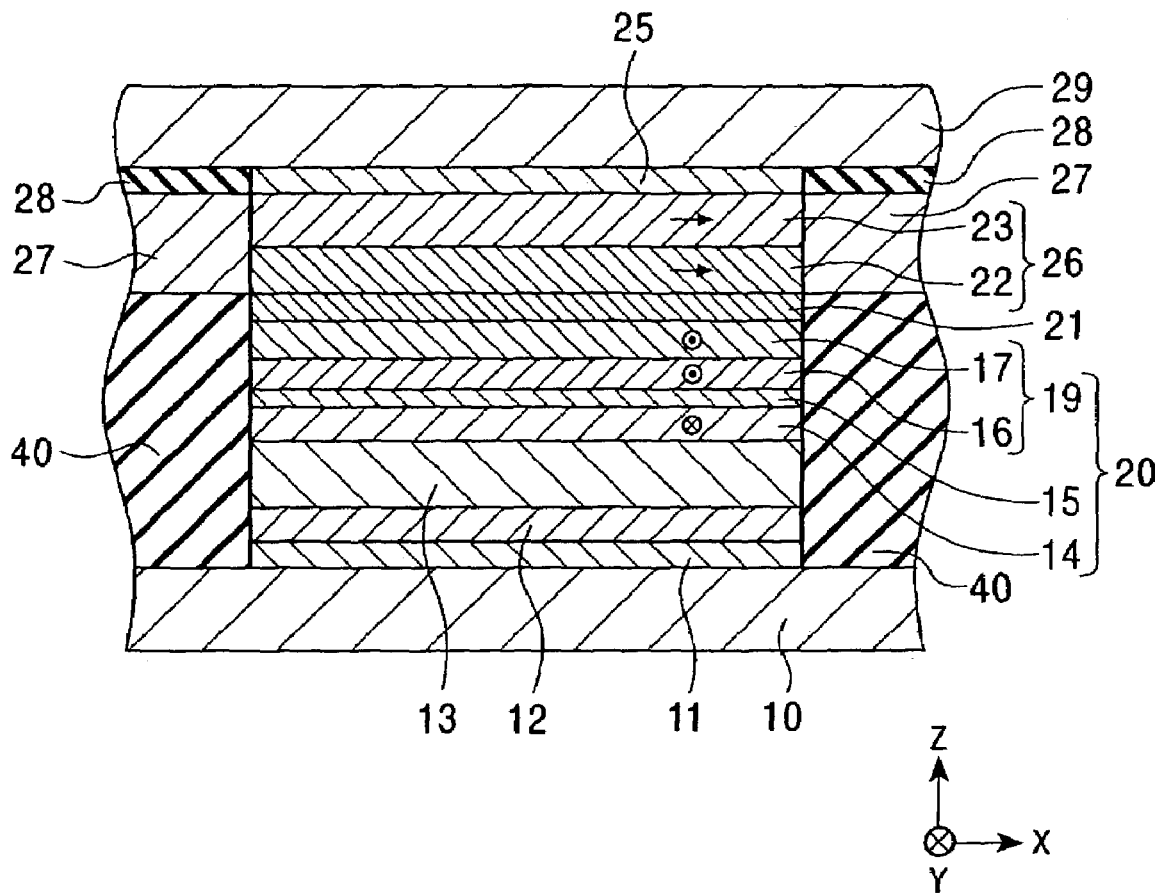
FIG. 2 is a partial sectional view of a magnetic sensing element in a second embodiment of the present invention, viewed from the surface facing a recording medium.

With respect to the embodiments shown in from FIG. 2 onward, materials having $\beta$ values or polarizabilities P with the same sign are also used for all the magnetic sublayers and the magnetic portions as described above.

FIG. 2 is a partial sectional view which shows a magnetic sensing element in a second embodiment of the present invention, viewed from the surface facing a recording medium. From FIG. 2 onward, description will be focused on the structures of the pinned magnetic layer 20 and the free magnetic layer 26. The layers other than these layers are the same as those in the magnetic sensing element shown in FIG. 1.

In the pinned magnetic layer 20 shown in FIG. 2, the first magnetic sublayer 19 has a two-layered structure including a magnetic portion 17 and a magnetic portion 16. The magnetic portion 17 is a half-metallic ferromagnetic alloy layer, and the magnetic portion 16 is preferably composed of any one of magnetic material selected from the group consisting of CoFe alloys, CoFeNi alloys, NiFe alloys, and Co.

In the embodiment shown in FIG. 2, the free magnetic layer 26 also has a two-layered structure including a magnetic sublayer 22 and a magnetic sublayer 23. The magnetic sublayer 22 is a half-metallic ferromagnetic alloy layer, and the magnetic sublayer 23 is composed of a magnetic material selected from the group consisting of CoFe alloys, CoFeNi alloys, NiFe alloys, and Co.

Preferably, the half-metallic ferromagnetic alloy layer is composed of a Heusler alloy represented by the formula $X_2YZ$, wherein X is an element selected from the group consisting of groups IIIA to IIB elements of the periodic table, Y is Mn, and Z is at least one element selected from the group consisting of Al, Si, Ga, Ge, In, Sn, Tl, Pb, and Sb; a Heusler alloy represented by the formula XYZ, wherein X is an element selected from the group consisting of groups IIIA to IIB elements of the periodic table, Y is Mn, and Z is at least one element selected from the group consisting of Al, Si, Ga, Ge, In, Sn, Tl, Pb, and Sb; or $La_{0.7}Sr_{0.3}MnO_3$, $CrO_2$, $Fe_3O_4$, or the like.

Since the pinned magnetic layer 20 and the free magnetic layer 26 contain the half-metallic ferromagnetic alloy layers, the difference in mean free path between spin-up electrons and spin-down electrons is increased, and the change in resistance ($\Delta R$) and the rate of change in resistance ($\Delta R/R$) can be improved.

When the magnetic portion 17 and the magnetic sublayer 22 in contact with the nonmagnetic material layer 21 are composed of the half-metallic ferromagnetic alloy layers, since there is a possibility that Mn contained in the alloy layers, if the alloy layers contain Mn, diffuses at the interfaces with the nonmagnetic material layer 21, the change in resistance ($\Delta R$) and the rate of change in resistance ($\Delta R/R$) are likely to be decreased compared to the embodiment shown in FIG. 1. However, it is possible to improve the change in resistance ($\Delta R$) and the rate of change in resistance ($\Delta R/R$) compared to the conventional case in which the first magnetic sublayer 19 and the free magnetic layer 26 are composed of only magnetic materials, such as CoFe alloys or NiFe alloys.

In the present invention, preferably, the half-metallic ferromagnetic alloy layers are composed of the Heusler alloys, $CrO_2$, $Fe_3O_4$, and the like in which the diffusion does not easily occur.

The diffusion is mainly caused by the annealing step for producing an exchange coupling magnetic field between the second magnetic sublayer 14 constituting the pinned magnetic layer 20 and the antiferromagnetic layer 13. When the annealing step is not required for producing the exchange coupling magnetic field or when the annealing temperature is low, the diffusion does not easily occur. In such a case, the magnetic portion 17 and the magnetic sublayer 22 can be formed using any material and a half-metallic ferromagnetic alloy may be used.

Figure 3:
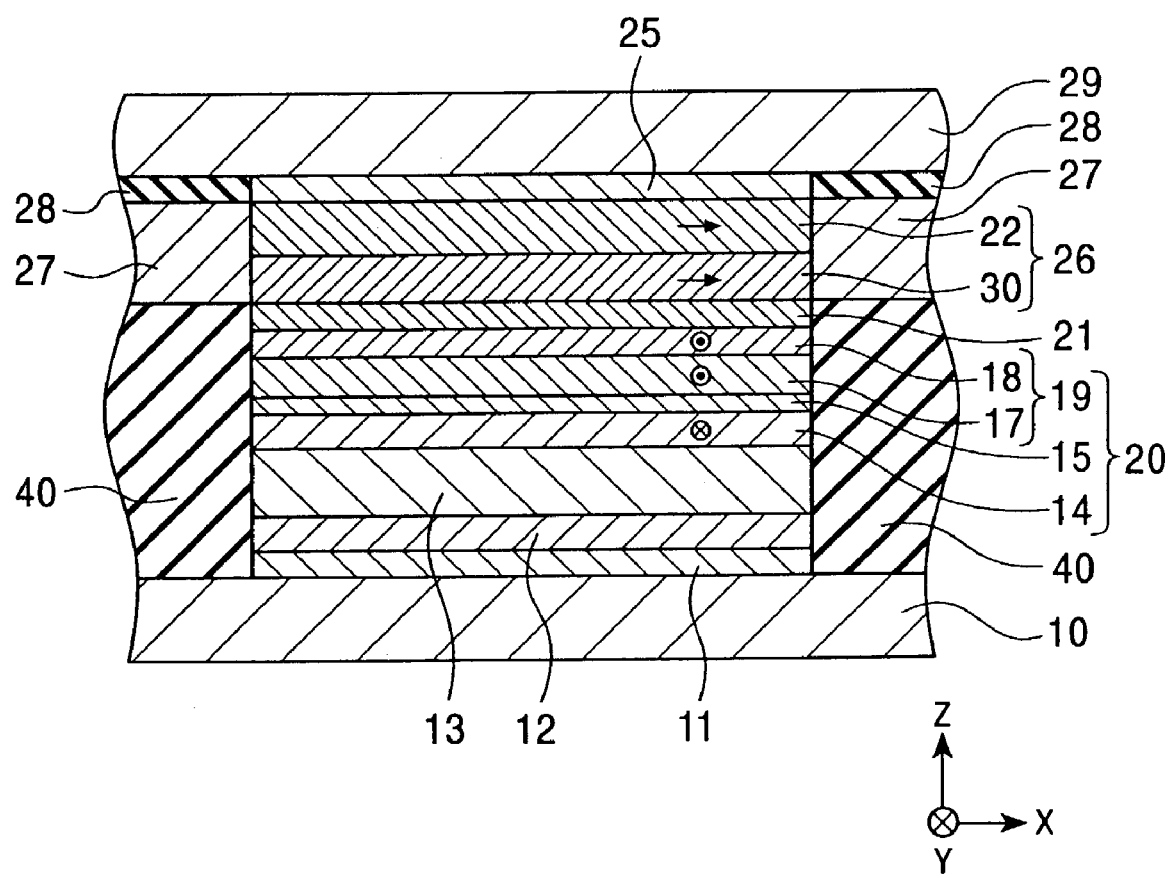
FIG. 3 is a partial sectional view of a magnetic sensing element in a third embodiment of the present invention, viewed from the surface facing a recording medium.

FIG. 3 is a partial sectional view which shows a magnetic sensing element in a third embodiment of the present invention, viewed from the surface facing a recording medium.

In the embodiment shown in FIG. 3, as in the case of the magnetic sensing element shown in FIG. 2, each of the first magnetic sublayer 19 constituting the pinned magnetic layer 20 and the free magnetic layer 26 has a two-layered structure. The magnetic portion 18 and the magnetic sublayer 30 in contact with the nonmagnetic material layer 21 are not half-metallic ferromagnetic alloy layers, but are layers composed of magnetic materials, such as CoFe alloys, CoFeNi alloys, NiFe alloys, or Co. Preferably, the magnetic portion 18 and the magnetic sublayer 30 are composed of CoFe alloys because diffusion at the interfaces with the nonmagnetic material layer can be more appropriately prevented.

In the embodiment shown in FIG. 3, the magnetic portion 17 and the magnetic sublayer 22 which are away from the nonmagnetic material layer 21 are half-metallic ferromagnetic alloy layers.

Preferably, the half-metallic ferromagnetic alloy layer is composed of a Heusler alloy represented by the formula $X_2YZ$, wherein X is an element selected from the group consisting of groups IIIA to IIB elements of the periodic table, Y is Mn, and Z is at least one element selected from the group consisting of Al, Si, Ga, Ge, In, Sn, Tl, Pb, and Sb; a Heusler alloy represented by the formula XYZ, wherein X is an element selected from the group consisting of groups IIIA to IIB elements of the periodic table, Y is Mn, and Z is at least one element selected from the group consisting of Al, Si, Ga, Ge, In, Sn, Tl, Pb, and Sb; or $La_{0.7}Sr_{0.3}MnO_3$, $CrO_2$, $Fe_3O_4$, or the like.

Since the pinned magnetic layer 20 and the free magnetic layer 26 contain the half-metallic ferromagnetic alloy layers, the difference in mean free path between spin-up electrons and spin-down electrons is increased, and the change in resistance ($\Delta R$) and the rate of change in resistance ($\Delta R/R$) can be improved.

In the embodiment shown in FIG. 3, since the magnetic portion 17 in contact with the intermediate nonmagnetic sublayer 15 is composed of a half-metallic ferromagnetic alloy layer, the coupling magnetic field due to the RKKY interaction produced between the first magnetic sublayer 19 and the second magnetic sublayer 14 may be weakened compared to the embodiment shown in FIG. 1. However, by decreasing the thickness of the magnetic portion 17, specifically, to 10 Å or less, it is possible to prevent the coupling magnetic field due to the RKKY interaction from being weakened, and the magnetization of the first pinned magnetic sublayer 19 can be pinned properly.

Figure 4:
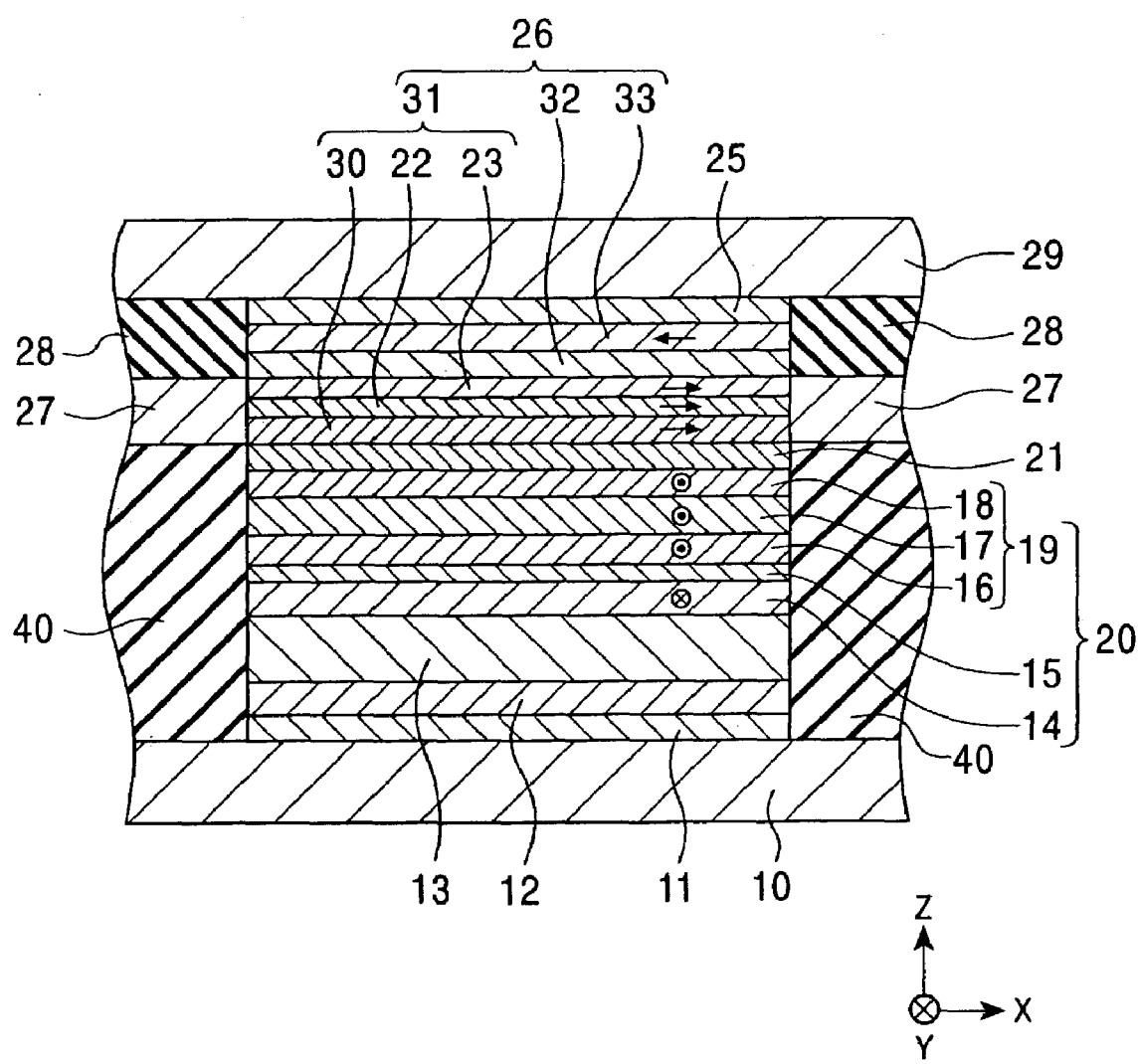
FIG. 4 is a partial sectional view of a magnetic sensing element in a fourth embodiment of the present invention, viewed from the surface facing a recording medium.

FIG. 4 is a partial sectional view which shows a magnetic sensing element in a fourth embodiment of the present invention, viewed from the surface facing a recording medium.

In the embodiment shown in FIG. 4, the pinned magnetic layer 20 has the same structure as that of the pinned magnetic layer 20 shown in FIG. 1.

In the magnetic sensing element shown in FIG. 4, the free magnetic layer 26 has a laminated ferrimagnetic structure including a first magnetic sublayer 31, a second magnetic sublayer 33, and an intermediate nonmagnetic sublayer 32 composed of Ru or the like interposed therebetween.

As shown in FIG. 4, the first magnetic sublayer 31 constituting the free magnetic layer 26 has a triple-layer structure. The central magnetic portion 22 among the three magnetic portions is a half-metallic ferromagnetic alloy layer.

Preferably, the half-metallic ferromagnetic alloy layer is composed of a Heusler alloy represented by the formula $X_2YZ$, wherein X is an element selected from the group consisting of groups IIIA to IIB elements of the periodic table, Y is Mn, and Z is at least one element selected from the group consisting of Al, Si, Ga, Ge, In, Sn, Tl, Pb, and Sb; a Heusler alloy represented by the formula XYZ, wherein X is an element selected from the group consisting of groups IIIA to IIB elements of the periodic table, Y is Mn, and Z is at least one element selected from the group consisting of Al, Si, Ga, Ge, In, Sn, Tl, Pb, and Sb; or $La_{0.7}Sr_{0.3}MnO_3$, $CrO_2$, $Fe_3O_4$, or the like.

Each of the magnetic portion 23 and the magnetic portion 30 sandwiching the magnetic portion 22 is preferably composed of a magnetic material selected from the group consisting of CoFe alloys, CoFeNi alloys, NiFe alloys, and Co. The magnetic portion 30 in contact with the nonmagnetic material layer 21 is more preferably composed of a CoFe alloy in order to appropriately prevent diffusion into the nonmagnetic material layer 21.

The magnetic portion 23 is preferably composed of a material having a small coercive force Hc in order to improve the sensitivity of the free magnetic layer 26 to an external magnetic field, and the magnetic portion 23 is preferably composed of a NiFe alloy. Additionally, a CoFe alloy layer may be provided between the magnetic portion 23 and the intermediate nonmagnetic sublayer 32 and/or between the magnetic sublayer 33 and the intermediate nonmagnetic sublayer 32 in order to increase antiferromagnetic coupling due to the RKKY interaction.

In the free magnetic layer 26 having the laminated ferrimagnetic structure, for example, if the first magnetic portion 31 including three magnetic portions is magnetized in the X direction under the influence of a longitudinal magnetic field from a hard bias layer 27 formed on each end face thereof, the second magnetic sublayer 33 is magnetized antiparallel to the magnetization direction of the first magnetic sublayer 31 due to a coupling magnetic field due to the RKKY interaction between the first magnetic sublayer 31 and the second magnetic sublayer 33.

In the embodiment shown in FIG. 4, since the first magnetic sublayer 19 of the pinned magnetic layer 20 contains the magnetic portion 17 composed of a half-metallic ferromagnetic alloy layer and the first magnetic sublayer 31 of the free magnetic layer 26 contains the magnetic portion 22 composed of a half-metallic ferromagnetic alloy layer, the difference in mean free path between spin-up electrons and spin-down electrons can be increased compared to the conventional case, and the change in resistance ($\Delta R$) and the rate of change in resistance ($\Delta R/R$) can be improved.

Figure 5:
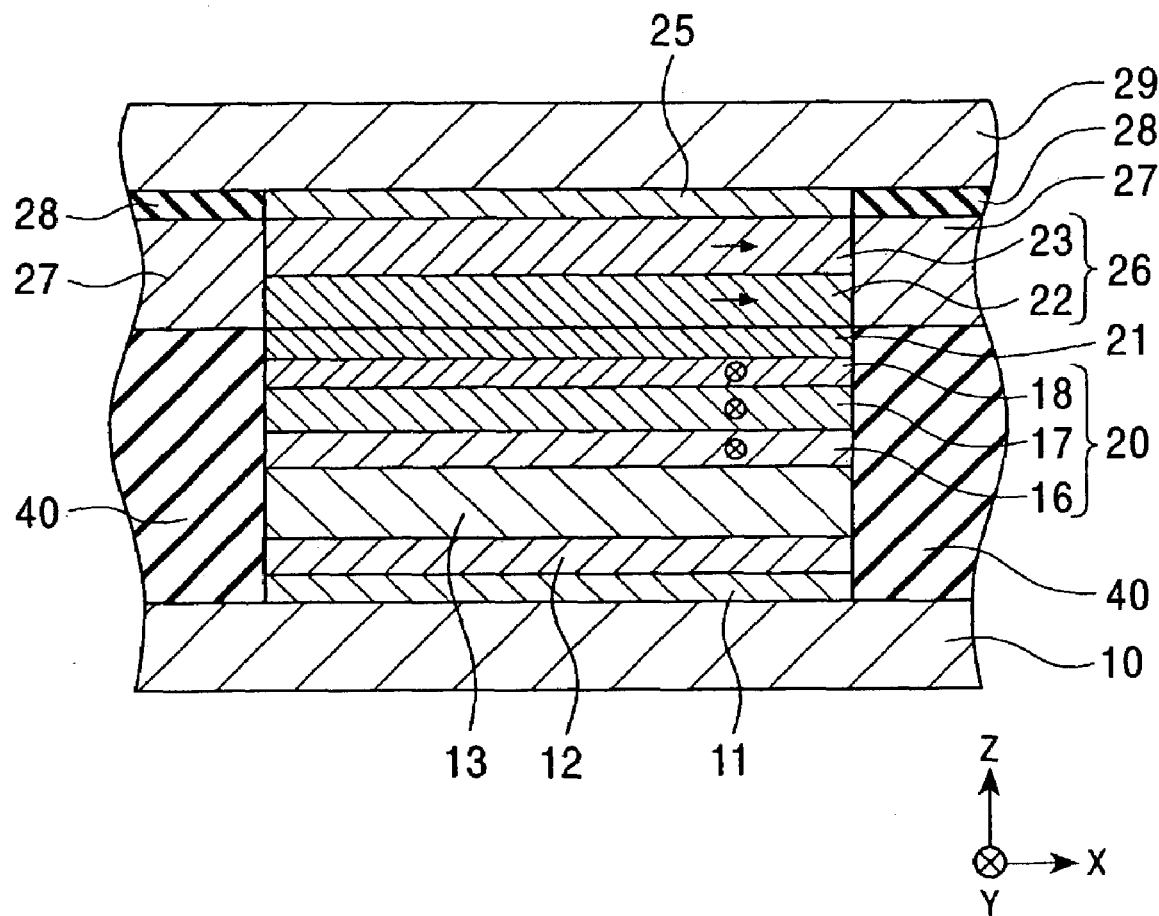
FIG. 5 is a partial sectional view of a magnetic sensing element in a fifth embodiment of the present invention, viewed from the surface facing a recording medium.

FIG. 5 is a partial sectional view which shows a magnetic sensing element in a fifth embodiment of the present invention, viewed from the surface facing a recording medium.

In the embodiment shown in FIG. 5, each of the pinned magnetic layer 20 and the free magnetic layer 26 has a multilayered structure including magnetic sublayers instead of a laminated ferrimagnetic structure. As shown in FIG. 5, the pinned magnetic layer 20 has a triple-layer structure including magnetic sublayers, and the central magnetic sublayer 17 is a half-metallic ferromagnetic alloy layer. Preferably, the magnetic sublayers sandwiching the magnetic sublayer 17 are composed of magnetic materials selected from the group consisting of CoFe alloys, CoFeNi alloys, NiFe alloys, and Co.

Since the magnetic sublayer 16 composed of a magnetic material, such as a CoFe alloy, is interposed between the antiferromagnetic layer 13 and the magnetic sublayer 17 composed of the half-metallic ferromagnetic alloy layer, the exchange coupling magnetic field produced between the antiferromagnetic layer 13 and the magnetic sublayer 16 can be increased, and the pinned magnetic layer 20 can be pinned appropriately. The magnetic sublayer 16 is preferably composed of a CoFe alloy, and thereby the exchange coupling magnetic field produced between the magnetic sublayer 16 and the antiferromagnetic layer 13 can be effectively increased.

In the embodiment shown in FIG. 5, the free magnetic layer 26 has a two-layered structure including magnetic sublayers. The magnetic sublayer 22 is a half-metallic ferromagnetic alloy layer, and the magnetic sublayer 23 is preferably composed of a magnetic material selected from the group consisting of CoFe alloys, CoFeNi alloys, NiFe alloys, and Co.

Although the free magnetic layer 26 has a two-layered structure including magnetic sublayers, the free magnetic layer 26 may have a triple-layer structure including magnetic sublayers as in the case of the magnetic sensing element shown in FIG. 1, or may have a two-layered structure including a magnetic sublayer 22 composed of a half-metallic ferromagnetic alloy layer and a magnetic sublayer 30 composed of a CoFe alloy or the like disposed between the magnetic sublayer 22 and the nonmagnetic material layer 21 as in the case of the magnetic sensing element shown in FIG. 3.

In the embodiment shown in FIG. 5, since the pinned magnetic layer 20 and the free magnetic layer 26 contain magnetic sublayers 17 and 22 composed of the half-metallic ferromagnetic alloy layers, the difference in mean free path between spin-up electrons and spin-down electrons can be increased compared to the conventional case, and the change in resistance ($\Delta R$) and the rate of change in resistance ($\Delta R/R$) can be improved.

Figure 6:
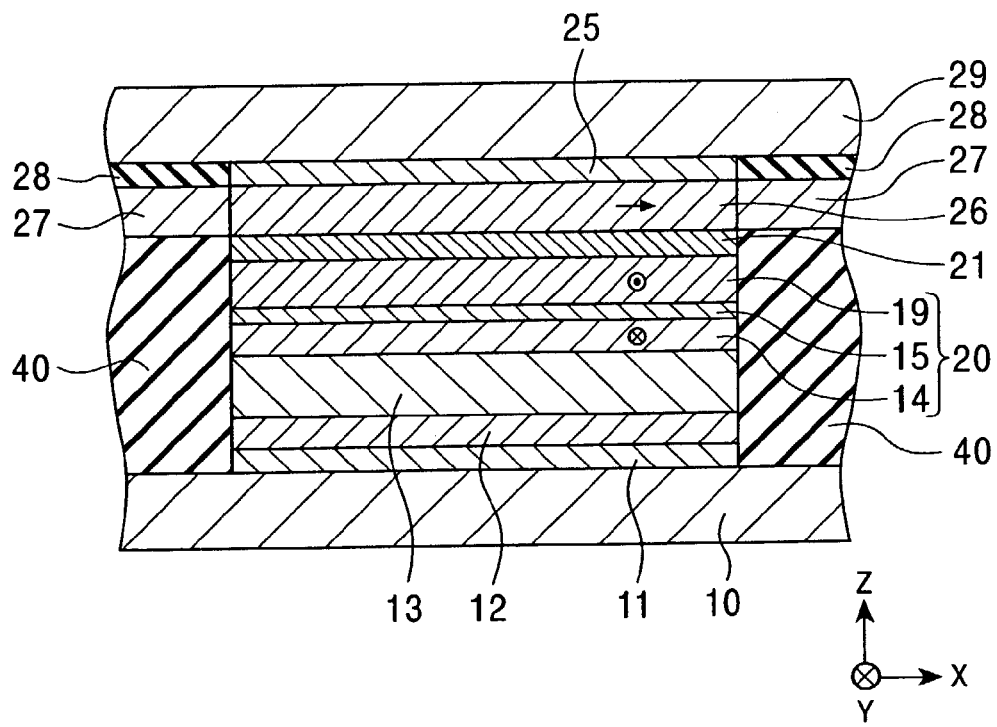
FIG. 6 is a partial sectional view of a magnetic sensing element in a sixth embodiment of the present invention, viewed from the surface facing a recording medium.

FIG. 6 is a partial sectional view which shows a magnetic sensing element in a sixth embodiment of the present invention, viewed from the surface facing a recording medium.

In the embodiment shown in FIG. 6, the pinned magnetic layer 20 has a laminated ferrimagnetic structure including a second magnetic sublayer 14, a first magnetic sublayer 19, and an intermediate nonmagnetic sublayer 15 composed of Ru or the like interposed therebetween. The first magnetic sublayer 19 has a single-layered structure composed of a half-metallic ferromagnetic alloy layer instead of a multilayered structure.

The free magnetic layer 26 also has a single-layered structure composed of a half-metallic ferromagnetic alloy layer.

If the first magnetic sublayer 19 and the free magnetic layer 26 have single-layered structures composed of the half-metallic ferromagnetic alloy layers, these layers can be easily formed.

When a material, e.g., PtMnSn, having a negative $\beta$ value is used for the half-metallic ferromagnetic alloy layer, since the materials, such as CoFe alloys and NiFe alloys, which have been generally used as magnetic layers have positive $\beta$ values, if such CoFe alloys and the half-metallic ferromagnetic alloy layer having negative $\beta$ value are combined, the spin polarizations cancel out each other, and thus it is not possible to obtain a large change in resistance ($\Delta R$) or a large rate of change in resistance ($\Delta R/R$). Therefore, the half-metallic ferromagnetic alloy layer having negative $\beta$ value is preferably formed as a single layer. In such a case, preferably, all of the second magnetic sublayer 14, the first magnetic sublayer 19, and the free magnetic layer 26 are composed of half-metallic ferromagnetic alloy layers having negative β values.

Figure 7:
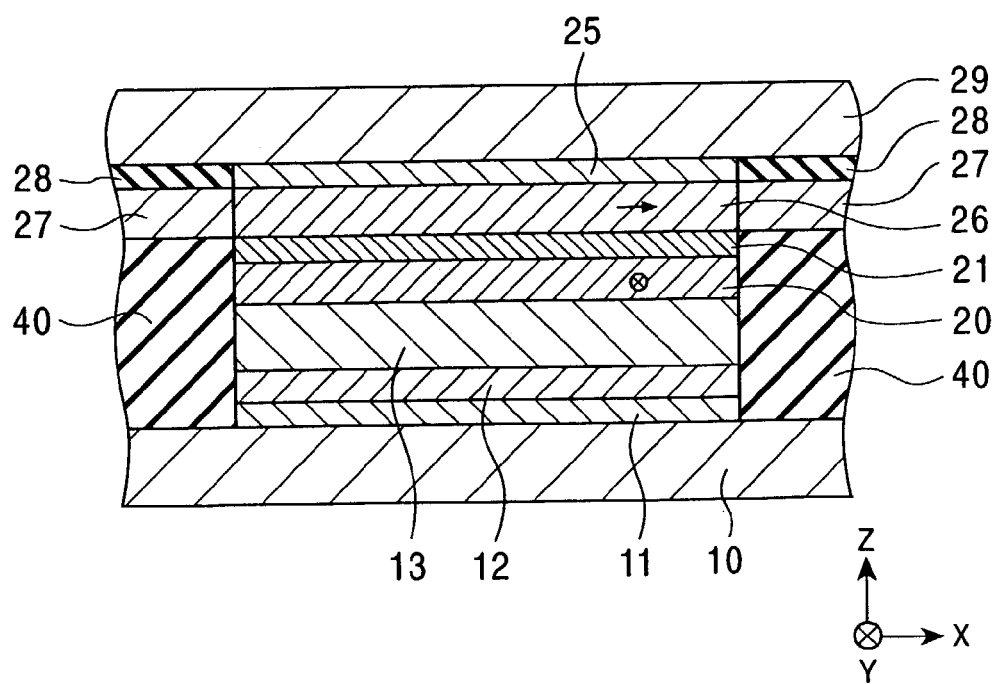
FIG. 7 is a partial sectional view of a magnetic sensing element in a seventh embodiment of the present invention, viewed from the surface facing a recording medium.
Figure 8:
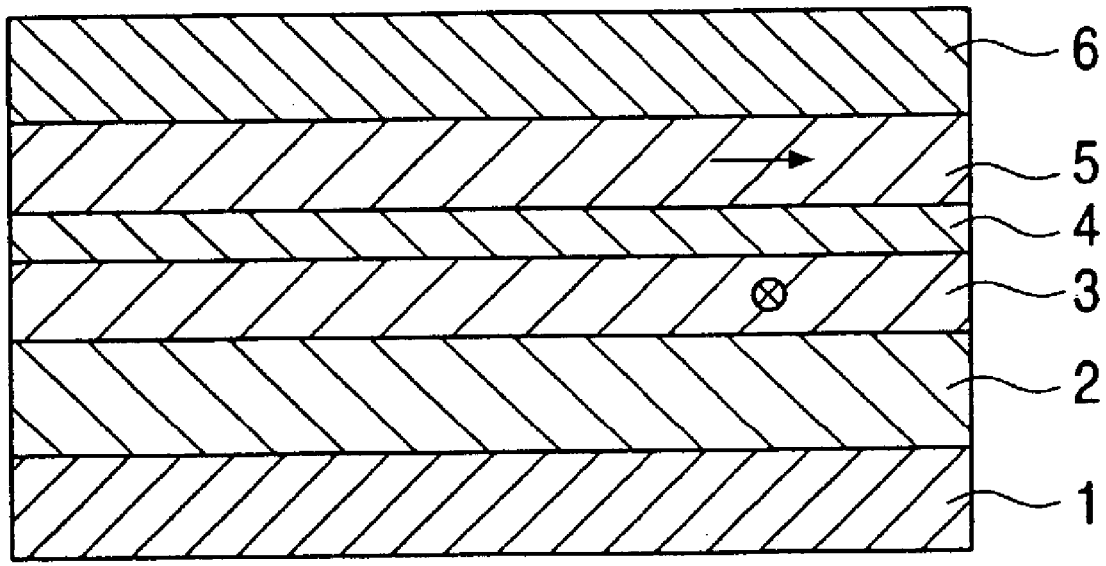
FIG. 8 is a partial sectional view of a conventional magnetic sensing element, viewed from the surface facing a recording medium.
Figure 8:
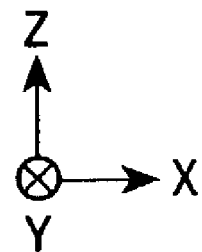

FIG. 7 is a partial sectional view which shows a magnetic sensing element in a seventh embodiment of the present invention, viewed from the surface facing a recording medium.

The pinned magnetic layer 20 in the embodiment shown in FIG. 7 has a single-layered structure composed of a half-metallic ferromagnetic alloy layer instead of a laminated ferrimagnetic structure. The free magnetic layer 26 also has a single-layered structure composed of a half-metallic ferromagnetic alloy layer instead of a laminated ferrimagnetic structure.

If the pinned magnetic layer 20 and the free magnetic layer 26 have single-layered structures composed of the half-metallic ferromagnetic alloy layers, these layers can be easily formed.

As shown in FIG. 6 or 7, when the pinned magnetic layer 20 and the free magnetic layer 26 are composed of the half-metallic ferromagnetic alloy layers, the difference in mean free path between spin-up electrons and spin-down electrons can be increased compared to the conventional case, and the change in resistance ($\Delta R$) and the rate of change in resistance ($\Delta R/R$) can be improved.

As shown in FIGS. 1 to 7, the present invention relates to CPP magnetic sensing elements. When the half-metallic ferromagnetic alloy layer which is the feature of the present invention is applied to a current-in-plane (CIP) magnetic sensing element, in which a current flows parallel to the constituent layers of the multilayer film, an increase in the change in resistance ($\Delta R$) or the rate of change in resistance ($\Delta R/R$) is not substantially expected. The reason for this is that since the half-metallic ferromagnetic alloy layer has a large resistivity, a shunt loss into the other layers is increased.

Accordingly, when the half-metallic ferromagnetic alloy layer of the present invention is used for a CPP magnetic sensing element, the change in resistance ($\Delta R$) and the rate of change in resistance ($\Delta R/R$) can be more effectively improved.

In the magnetic sensing element shown in any one of FIGS. 1 to 7, each of the pinned magnetic layer 20 and the free magnetic layer 26 includes a half-metallic ferromagnetic alloy layer. However, at least one of the pinned magnetic layer 20 and the free magnetic layer 26 may include the half-metallic ferromagnetic alloy layer.

In the embodiments shown in FIGS. 1 to 7, the number of layers included in the multilayered structure of a magnetic layer containing a half-metallic ferromagnetic alloy layer is three at the maximum (for example, refer to the first magnetic sublayer 19 and the free magnetic layer 26 in FIG. 1). The number may be 4 or more. In such a case, the half-metallic ferromagnetic alloy layer may be disposed at any position.

Although a structure in which the free magnetic layer 26 has a laminated ferrimagnetic structure and the pinned magnetic layer 20 has a single-layered or multilayered structure including only magnetic sublayers is not shown in the embodiments, such a structure is also acceptable in the present invention.

When each of the pinned magnetic layer 20 and the free magnetic layer 26 has a laminated ferrimagnetic structure in the embodiment shown in FIG. 4, each of the second magnetic sublayers 14 and 33 may also have a single-layered structure composed of a half-metallic ferromagnetic alloy layer or a multilayered structure containing a half-metallic ferromagnetic alloy layer as in the case of the first magnetic sublayer 19 or 31.

A combination of a laminated structure of the pinned magnetic layer 20 and a laminated structure of the free magnetic layer 26, which is not shown in FIGS. 1 to 7, is also acceptable. For example, a magnetic sensing element may include a combination of the laminated structure of the pinned magnetic layer 20 shown in FIG. 1 and the laminated structure of the free magnetic layer 26 shown in FIG. 2.

In each of the magnetic sensing elements shown in FIGS. 1 to 7, the antiferromagnetic layer 13, the pinned magnetic layer 20, the nonmagnetic material layer 21, and the free magnetic layer 26 are deposited in that order from the bottom. However, the free magnetic layer 26, the nonmagnetic material layer 21, the pinned magnetic layer 20, and the antiferromagnetic layer 13 may be deposited in that order from the bottom.

Each of the magnetic sensing elements shown in FIGS. 1 to 7 is a single spin-valve thin-film element in which one pinned magnetic layer and one free magnetic layer are provided. The present invention is also applicable to dual spin-valve thin-film element in which an antiferromagnetic layer, a pinned magnetic layer, a nonmagnetic material layer, a free magnetic layer, a nonmagnetic material layer, a pinned magnetic layer, and an antiferromagnetic layer are deposited from the bottom.

Additionally, magnetic sensing elements of the present invention can also be used for magnetic heads for tape recording, magnetic sensors, etc., in addition to thin-film magnetic heads built in hard disk apparatuses.

What is claimed is:

1. A magnetic sensing element comprising:
   a multilayer film comprising an antiferromagnetic layer, a pinned magnetic layer, a nonmagnetic conductive material layer, and a free magnetic layer,
   wherein a current flows perpendicular to planes of the individual layers of the multilayer film, and at least one of the pinned magnetic layer and the free magnetic layer comprises a half-metallic ferromagnetic alloy,
   wherein the nonmagnetic conductive layer is interposed between the free magnetic layer and the pinned magnetic layer, and is in contact with the free magnetic layer and the pinned magnetic layer,
   wherein the pinned magnetic layer and the free magnetic layer has a laminated ferrimagnetic structure including a first magnetic sublayer, a second magnetic sublayer, and an intermediate nonmagnetic sublayer, the first magnetic sublayer is in contact with the nonmagnetic material layer,
   wherein the first magnetic sublayer has a triple-layer structure including a central magnetic sublayer and two outer magnetic sublayers, and the central magnetic sublayer comprises the half-metallic ferromagnetic alloy,
   wherein the half-metallic ferromagnetic alloy is $Co_{0.5}Mn_{0.25}(Al_{100-a}Si_a)_{0.25}$, wherein a is 0 to 100, and
   wherein the free magnetic layer and the central magnetic sublayer and the two outer magnetic sublayers of the triple-layer are each composed of a material whose β value is negative, the value β satisfying the relationship $\rho\!\downarrow/\rho\!\uparrow=(1+\beta)/(1-\beta)$, where $\rho\!\downarrow$ is the resistivity to spin-down conduction electrons and $\rho\!\uparrow$ is the resistivity to spin-up conduction electrons.

2. A magnetic sensing element comprising:

a multilayer film comprising an antiferromagnetic layer, a pinned magnetic layer, a nonmagnetic conductive material layer, and a free magnetic layer, wherein a current flows perpendicular to planes of the individual layers of the multilayer film, and at least one of the pinned magnetic layer and the free magnetic layer comprises a half-metallic ferromagnetic alloy, wherein the nonmagnetic conductive layer is interposed between the free magnetic layer and the pinned magnetic layer, and is in contact with the free magnetic layer and the pinned magnetic layer, wherein the pinned magnetic layer and the free magnetic layer has a laminated ferrimagnetic structure including a first magnetic sublayer, a second magnetic sublayer, and an intermediate nonmagnetic sublayer, the first magnetic sublayer is in contact with the nonmagnetic material layer, wherein the first magnetic sublayer has a triple-layer structure including a central magnetic sublayer and two outer magnetic sublayers, and the central magnetic sublayer comprises the half-metallic ferromagnetic alloy, wherein the free magnetic layer and the central magnetic sublayer and the two outer magnetic sublayers of the triple-layer are each composed of a material whose $\beta$ value is negative, the value $\beta$ satisfying the relationship $\rho\Downarrow/\rho\Uparrow=(1+\beta)/(1-\beta)$, where $\rho\Downarrow$ is the resistivity to spin-down conduction electrons and $\rho\Uparrow$ is the resistivity to spin-up conduction electrons, wherein the half-metallic ferromagnetic alloy is one of NiMnSb, PtMnSb, and PdMnSb.

3. A magnetic sensing element according to claim 1, wherein the second magnetic sublayer comprises a magnetic material selected from the group consisting of CoFe alloys, CoFeNi alloys, NiFe alloys, and Co.

4. A magnetic sensing element according to claim 1, wherein the outer magnetic sublayers comprise a magnetic material selected from the group consisting of CoFe alloys, CoFeNi alloys, NiFe alloys, and Co.

5. The magnetic sensing element according to claim 2, wherein the outer magnetic sublayers comprise a magnetic material selected from the group comprising of FeV alloy, NiCr alloy, and FeCr alloy.

* * * * *

UNITED STATES PATENT AND TRADEMARK OFFICE
CERTIFICATE OF CORRECTION

PATENT NO. : 7,336,451 B2 Page 1 of 1
APPLICATION NO. : 10/348479
DATED : February 26, 2008
INVENTOR(S) : Masamichi Saito It is certified that error appears in the above-identified patent and that said Letters Patent is hereby corrected as shown below:

In the Claims

Column 18, in claim 1, line 64, after "value is" delete "negative" and substitute --positive-- in its place.

Signed and Sealed this

Twenty-first Day of December, 2010

David J. Kappos
*Director of the United States Patent and Trademark Office*